(12) United States Patent
Longoni et al.

(10) Patent No.: US 12,336,432 B2
(45) Date of Patent: Jun. 17, 2025

(54) MICRO ELECTRO MECHANICAL SYSTEM AND MANUFACTURING METHOD THEREOF

(71) Applicant: STMICROELECTRONICS S.r.l., Agrate Brianza (IT)

(72) Inventors: Gianluca Longoni, Cernusco sul Naviglio (IT); Luca Seghizzi, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/535,923

(22) Filed: Dec. 11, 2023

(65) Prior Publication Data
US 2024/0130240 A1    Apr. 18, 2024

Related U.S. Application Data

(62) Division of application No. 17/181,432, filed on Feb. 22, 2021, now Pat. No. 11,889,765.

(30) Foreign Application Priority Data

Feb. 26, 2020 (IT) .................. 102020000003967

(51) Int. Cl.
*H10N 30/20* (2023.01)
*B81B 3/00* (2006.01)
(Continued)

(52) U.S. Cl.
CPC ....... *H10N 30/2042* (2023.02); *B81B 3/0021* (2013.01); *H02N 2/186* (2013.01);
(Continued)

(58) Field of Classification Search
None
See application file for complete search history.

(56) References Cited

U.S. PATENT DOCUMENTS

| 8,723,398 | B2 | 5/2014 | Lee |
| 2008/0174273 | A1 | 7/2008 | Priya et al. |
| | | (Continued) | |

FOREIGN PATENT DOCUMENTS

| WO | WO 2011058874 A1 | 5/2011 |
| WO | WO 2018105132 A1 | 6/2018 |

OTHER PUBLICATIONS

Felmetsger et al., "Sputter Deposition of Piezoelectric AlN Thin Films on Vertical Walls of Micromechanical Devices," 2nd International Workshop on Piezoelectric MEMS, Lausanne, Switzerland, Sep. 6-7, 2011, 20 pages.
(Continued)

*Primary Examiner* — Benjamin P Sandvik
(74) *Attorney, Agent, or Firm* — Seed IP Law Group LLP

(57) ABSTRACT

A MEMS device is provided that includes a semiconductor substrate including a main surface extending perpendicular to a first direction and a side surface extending on a plane parallel to the first direction and to a second direction that is perpendicular to the first direction. At least one cantilevered member protrudes from the side surface of the semiconductor substrate along a third direction that is perpendicular to the first and second directions. The at least one cantilevered member includes a body portion that includes a piezoelectric material. The body portion has a length along the third direction, a height along the first direction and a width along the second direction, and the height is greater than the width. The at least one cantilevered member is configured to vibrate by lateral bending along a direction perpendicular to the first direction.

19 Claims, 17 Drawing Sheets

(51) Int. Cl.
  *H02N 2/18* (2006.01)
  *H10N 30/00* (2023.01)
  *H10N 30/05* (2023.01)
  *H10N 30/074* (2023.01)

(52) U.S. Cl.
  CPC ........... *H10N 30/05* (2023.02); *H10N 30/074* (2023.02); *H10N 30/706* (2024.05); *B81B 2203/0118* (2013.01)

(56) References Cited

U.S. PATENT DOCUMENTS

| | | |
|---|---|---|
| 2008/0252174 A1 | 10/2008 | Mohammadi et al. |
| 2012/0068576 A1 | 3/2012 | Lee |
| 2013/0127295 A1 | 5/2013 | Jun et al. |
| 2013/0154439 A1 | 6/2013 | Lee et al. |
| 2013/0313946 A1 | 11/2013 | Lee et al. |
| 2016/0373031 A1 | 12/2016 | Procopio et al. |
| 2018/0262130 A1 | 9/2018 | Okada et al. |
| 2019/0315622 A1 | 10/2019 | Higuchi et al. |

OTHER PUBLICATIONS

Karmazyn, "Synchronization of coupled mechanical oscillators in the presence of noise and parameter mismatch," doctoral thesis, Lodz University of Technology, 2014, 102 pages.

Liu et al., "Piezoelectric MEMS Energy Harvester for Low-Frequency Vibrations With Wideband Operation Range and Steadily Increased Output Power," *Journal of Microelectromechanical Systems* 20(5):1131-1142, Oct. 2011.

Mackus et al., "From the Bottom-Up: Toward Area-Selective Atomic Layer Deposition with High Selectivity," *Chem. Mater.* 31:2-12, 2019.

Palokangas et al., "Direct Bonding of Oxidized Cavity Wafers," *ECS Transactions* 16(8), 2008, 7 pages.

Suni et al., "Silicon-on-Insulator Wafers with Buried Cavities," *Journal of The Electromechanical Society* 153(4):G299-G303, 2006.

Yoshida et al., "Fabrication and characterization of laterally-driven piezoelectric bimorph MEMS actuator with sol-gel-based high-aspect-ratio PZT structure," *J. Micromech. Microeng.* 23, 2013, 11 pages.

MICRO ELECTRO MECHANICAL SYSTEM AND MANUFACTURING METHOD THEREOF

BACKGROUND

Technical Field

The present disclosure relates to the field of the Micro Electro Mechanical Systems (hereinafter referred to as "MEMS").

Description of the Related Art

A MEMS device comprises miniaturized mechanical, electrical and/or electronic components integrated in a same semiconductor material substrate, for example, silicon, by means of micromachining techniques (for example, lithography, deposition, etching, growth).

MEMS device can be used in a wide range of different applications, such as for implementing energy harvesting devices, optical switches, radio-frequency switched and micromanipulators.

Energy harvesting is the process of converting ambient energy present in the environment into electrical energy for powering electronic devices. Sources of energy that can be harvested comprise both natural sources readily available from the environment and artificial sources generated from system activities, such as the vibration energy generated by a mechanical system when the latter is operating.

Among the known MEMS energy harvesting devices, Piezoelectric Energy Harvesting devices (hereinafter, briefly referred to as "PEH devices") are known. A PEH device is a MEMS energy harvesting device including a piezoelectric element designed to convert vibration energy into electrical energy.

PEH devices may comprise a (e.g., silicon) substrate having a main surface and (silicon) cantilevered members suspended with respect to the substrate. The cantilevered members are configured to vibrate (e.g., through bending) along a direction perpendicular to the main surface of the substrate at a corresponding resonance frequency when the PEH device moves and/or is subjected to vibrations. This kind of vibration is also referred to as "out-of-plane vibration", in the sense that the cantilevered members intersect a plane comprising the main surface of the substrate when they vibrate. Each cantilevered member supports a thin layer of piezoelectric material between two conductive layers acting as electrodes. When the PEH device moves and/or is subjected to vibrations, the cantilevered members start to vibrate. The vibration of each cantilevered member causes the corresponding layer of piezoelectric material to bend and accordingly generate an electric potential difference across the electrodes thereof, which can be provided to an external load through proper electric connections.

These kind of PEH devices can be used for powering low-power sensing nodes in Internet of Things ("IoT") sensing networks and in other low power applications, such as, for example, as powering aids for extending battery life of electronic portable devices.

BRIEF SUMMARY

The Applicant has found that the known PEH devices are not particularly efficient because affected by several drawbacks.

Cantilevered members in the known PEH devices comprises thin layers of different materials (comprising a thin piezoelectric layer) stacked on top of each other. Since cantilevered members manufactured by overlapping different thin layers on the top of each other are subjected to upward or downward bending depending on structural stresses affecting said overlapped layers, and since such bending negatively affect the conversion efficiency of the PEH device, known solutions provide to reduce such unwanted bending by providing cantilevered members with a reduced aspect ratio (length-to-width ratio).

However, PEH devices having cantilevered members with reduced aspect ratio cannot efficiently generate energy at lower resonance frequencies (e.g., lower than 1 KHz). It has to be appreciated that the abovementioned bending drawback is exacerbated in case the cantilevered member is provided with a seismic mass for the tuning of the resonance frequency.

Moreover, PEH devices using cantilevered members with a reduced aspect ratio usually produce only low output voltages.

Another disadvantage of known PEH devices relates to the manufacturing process thereof. Specifically, because of manufacturing process tolerances, the thin piezoelectric layers of the cantilevered members of a single PEH device are usually affected by different superficial stresses, causing mismatching in the vibrations.

The Applicant has found that other kinds of MEMS devices having cantilevered members comprising piezoelectric material (e.g., optical switches, radio-frequency switched and micromanipulators) can be affected by similar drawbacks.

In view of the above, the Applicant has devised a solution for obtaining an improved MEMS device having cantilevered members comprising piezoelectric material.

An aspect of the present disclosure relates to a MEMS device.

According to an embodiment of the present disclosure, the MEMS device comprises a semiconductor substrate comprising a main surface extending perpendicular to a first direction and a side surface extending on a plane parallel to the first direction and to a second direction.

According to an embodiment of the present disclosure, said second direction is perpendicular to said first direction.

According to an embodiment of the present disclosure, at least one cantilevered member protrudes from the side surface of the semiconductor substrate along a third direction perpendicular to said first and second directions.

According to an embodiment of the present disclosure, each cantilevered member comprises a body portion comprising a piezoelectric material.

According to an embodiment of the present disclosure, said body portion has a length along the third direction, a height along the first direction and a width along the second direction.

According to an embodiment of the present disclosure said height is larger than said width.

According to an embodiment of the present disclosure, each cantilevered member is thus configured to vibrate by lateral bending along a direction perpendicular to the first direction.

According to an embodiment of the present disclosure, each body portion has a first end connected to the side surface of the semiconductor substrate and a second free end opposite to the first end.

According to an embodiment of the present disclosure, said body portion comprises a layer of piezoelectric material between two collector layers.

According to an embodiment of the present disclosure said layer of piezoelectric material and each of said two collector layers extends from said first end to said second end of the body portion along said first direction and along said third direction.

According to an embodiment of the present disclosure, said piezoelectric material has a crystalline orientation perpendicular to said first direction.

According to an embodiment of the present disclosure each body portion comprises a seismic mass portion connected to the second end thereof.

According to an embodiment of the present disclosure, each cantilevered member is associated to a corresponding first conductive track and a second conductive track electrically coupled to the piezoelectric material of the body portion of said cantilevered member at spaced apart regions of the piezoelectric material spaced apart along the second direction.

According to an embodiment of the present disclosure, a corresponding voltage difference develops across said first and second conductive tracks when cantilevered member vibrates.

According to an embodiment of the present disclosure, said first and second conductive tracks contact the collector layers of the body portion of the corresponding cantilevered member.

According to an embodiment of the present disclosure, the MEMS device further comprises a plurality of cantilevered members.

According to an embodiment of the present disclosure, the first conductive tracks associated to each cantilevered member are connected to a same first common conductive track.

According to an embodiment of the present disclosure, the second conductive tracks associated to each cantilevered member are connected to a same second common conductive track.

According to an embodiment of the present disclosure, said semiconductor substrate is movably coupled to a fixed substrate by means of an elastic support structure.

According to an embodiment of the present disclosure, the MEMS device is a piezoelectric energy harvester device.

Another aspect of the present disclosure relates to an electronic system comprising one or more MEMS devices.

Another aspect of the present disclosure relates to a method for manufacturing a MEMS device.

According to an embodiment of the present disclosure, the method comprises providing a semiconductor substrate comprising a main surface extending perpendicular to a first direction and a side surface extending on a plane parallel to the first direction and to a second direction.

According to an embodiment of the present disclosure, said second direction is perpendicular to said first direction.

According to an embodiment of the present disclosure, the method comprises forming at least one cantilevered member protruding from the side surface of the semiconductor substrate along a third direction perpendicular to said first and second directions.

According to an embodiment of the present disclosure, each cantilevered member comprises a body portion comprising a piezoelectric material.

According to an embodiment of the present disclosure, said body portion has a length along the third direction, a height along the first direction and a width along the second direction.

According to an embodiment of the present disclosure, said height is larger than said width.

According to an embodiment of the present disclosure, each cantilevered member is thus configured to vibrate by lateral bending along a direction perpendicular to the first direction.

According to an embodiment of the present disclosure, said forming at least one cantilevered member comprises providing a starting semiconductor substrate having a first surface.

According to an embodiment of the present disclosure, said forming at least one cantilevered member further comprises forming oxide portions on said starting semiconductor substrate.

According to an embodiment of the present disclosure, said oxide portions are raised with respect to the first surface along the first direction, and are spaced apart to each other along the second direction.

According to an embodiment of the present disclosure, said forming at least one cantilevered member further comprises forming semiconductor portions on portions of exposed surfaces of said oxide portions to define an alternating sequence of recesses and semiconductor portions.

According to an embodiment of the present disclosure, each semiconductor portion is astride two oxide portions and defines a corresponding cavity with said two oxide portions.

According to an embodiment of the present disclosure, each recess has a bottom surface corresponding to an exposed surface portion of an oxide portion and side surfaces corresponding to side surfaces of two semiconductor portions.

According to an embodiment of the present disclosure, said forming at least one cantilevered member further comprises filling said recesses with piezoelectric material.

According to an embodiment of the present disclosure, said forming at least one cantilevered member further comprises forming said at least one cantilevered member by opening vias in the semiconductor portions along said first direction until reaching the cavities.

According to an embodiment of the present disclosure, said filling said recesses with piezoelectric material comprises filling said recesses with piezoelectric material having a crystalline orientation perpendicular to said first direction.

According to an embodiment of the present disclosure, said forming semiconductor portions on portions of exposed surfaces of said oxide portions comprises attaching a semiconductor wafer to said portions of exposed surfaces of said oxide portions through wafer fusion bonding.

According to an embodiment of the present disclosure, said forming semiconductor portions on portions of exposed surfaces of said oxide portions further comprises selectively removing sections of the attached semiconductor wafer.

According to an embodiment of the present disclosure, said filling said recesses with piezoelectric material comprises growing piezoelectric material films on the side surfaces of the silicon portions.

According to an embodiment of the present disclosure, said filling said recesses with piezoelectric material further comprises deposing a layer of piezoelectric material to fill the recesses through reactive sputtering deposition using said piezoelectric material film as seeds.

BRIEF DESCRIPTION OF THE DRAWINGS

These and others features and advantages of the solution according to the present disclosure will be better understood by reading the following detailed description of an embodiment thereof, provided merely by way of non-limitative example, to be read in conjunction with the attached drawings. On this regard, it is explicitly intended that the drawings are not necessarily drawn to scale (with some details thereof that can be exaggerated and/or simplified) and that, unless otherwise stated, they are simply used for conceptually illustrating the described structures and procedures. Particularly.

DETAILED DESCRIPTION

Figure 1A:
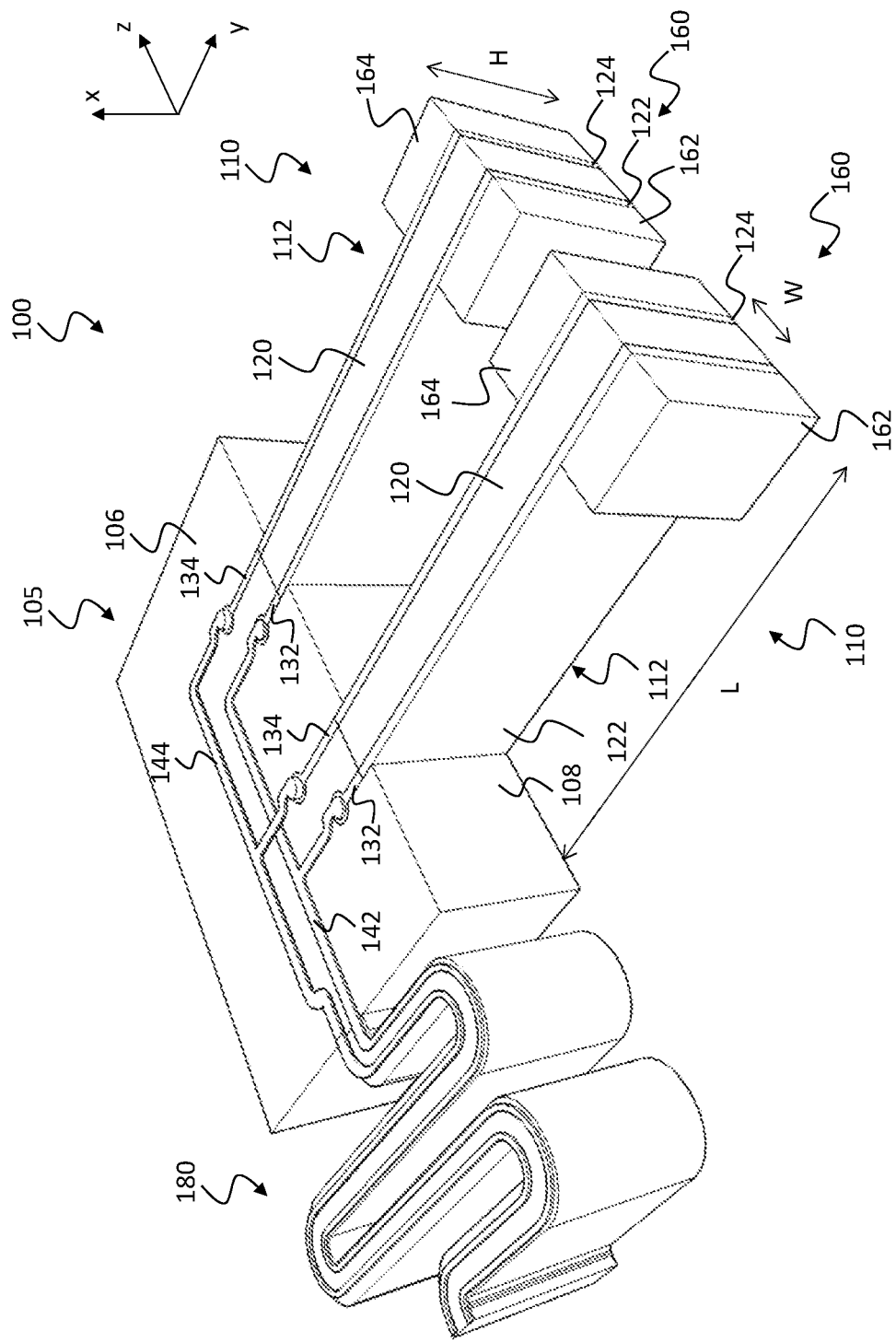
FIGS. 1A and 1B schematically illustrate a PEH device according to an embodiment of the present disclosure.
Figure 1B:
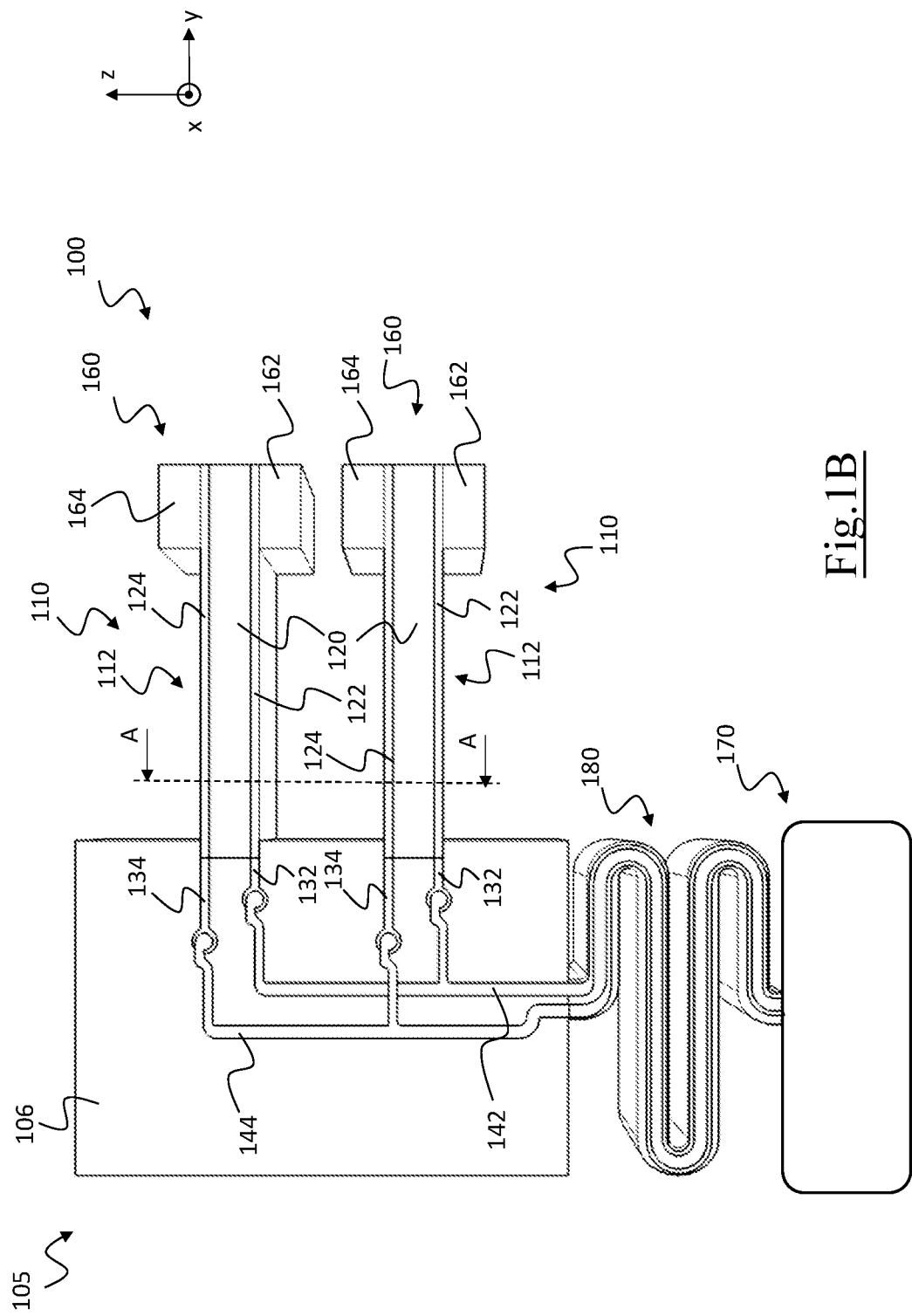

FIGS. 1A and 1B schematically illustrate a (portion of a) PEH device, globally identified with reference 100, according to an embodiment of the present disclosure.

In the following of the present description, direction terminology (such as for example, top, bottom, higher, lower, lateral, central longitudinal, transversal, vertical) will be only used for describing the PEH device 100 in relation to the very specific orientation illustrated in the figures, and not for describing possible specific orientation the PEH device 100 will have during its operation.

On this regard, a reference direction system is shown including three orthogonal directions X, Y, Z.

FIG. 1A is a simplified perspective view of a portion of the PEH device 100 according to an embodiment of the present disclosure, while FIG. 1B is a top view of the portion of the PEH device 100 of FIG. 1A parallel to directions Y and Z.

According to an embodiment of the present disclosure, the PEH device 100 comprises a semiconductor substrate 105, e.g., a silicon substrate, having a main surface 106 extending perpendicular to direction X, and side surfaces 108 that extend parallel to directions X and Z. By main surface 106 of the semiconductor substrate 105 it is herein intended the active surface of the substrate, i.e., the surface thereof wherein most of the electric and electronic components, as well conductive tracks, contacts and insulation elements, are integrated. The main (or active) surface is the surface of the substrate that is normally exposed and subjected to the lithographic operations (deposition, etching, growth, implantation) during the manufacturing process of the device. The area of the main surface 106 (and therefore of the opposite surface) is normally much larger than the area of any of the side surfaces 108.

According to an embodiment of the present disclosure, the PEH device 100 comprises one or more (in the example at issue, two) cantilevered members 110 which protrude from the semiconductor substrate 105 and are configured to move (i.e., vibrate) with respect to the latter.

According to an embodiment of the present disclosure, each cantilevered member 110 comprises a body portion 112 having a first end connected to a side surface 108 of the semiconductor substrate 105 and a second free end. The body portion 112 extends from the first end to the second end along the direction Y.

According to an embodiment of the present disclosure, the body portion 112 has a length L along the direction Y that is larger than its height H along the direction X.

According to an embodiment of the present disclosure, the body portion 112 has the height H along the direction X that is higher than its width W along the direction Z.

According to an embodiment of the present disclosure, the height H of the body portion 112 corresponds (e.g., it is substantially equal) to the thickness of the semiconductor substrate 105 along the direction X. In this way, the body portion 112 substantially extends along the direction X for the entire side surface 108.

According to an embodiment of the present disclosure, the body portion 112 comprises three different layers parallel to the directions X and Y and stacked to each other along direction Z. According to an embodiment of the present disclosure, these layers comprise a central layer 120 made of a piezoelectric material, such as aluminum nitride (AlN), between two collector layers 122, 124 comprising a conductive material, such as a conductive semiconductor material (e.g., silicon comprising p-doped silicon regions).

According to the embodiments of the present disclosure, the body portions 112 of each cantilevered member 110 are configured to bend and move (i.e., vibrate) with respect to the semiconductor substrate 105 when the PEH device 100 moves. Thanks to the peculiar ratio among the length L, width W, and height H of the body portions 112—i.e., L>H>W—, according to the embodiments of the present disclosure, each body portion 112 is configured to vibrate, about an equilibrium position in which the body portion 112 is perpendicular to the side surface 108 of the semiconductor substrate 105 (i.e., the one illustrated in the figures), at a corresponding resonance frequency by lateral bending along a direction perpendicular to the direction X. In other words, the body portions 112 are configured to vibrate along a direction parallel to the main surface 106 of the semiconductor substrate 105. This kind of vibration is also referred to as "in-plane vibration", in the sense that the body portions 112, and therefore the cantilevered members 110, do not intersect a plane comprising the main surface 106 of the semiconductor substrate 105 when they vibrate.

According to an exemplary embodiment of the present disclosure, the height H of the body portions 112 may range from 10 to 50 μm.

According to an exemplary embodiment of the present disclosure, the width W of the body portions 112 may range from 2 to 4 μm.

According to an exemplary embodiment of the present disclosure, the length L of the body portions 112 may range from 1000 to 5000 μm.

According to an embodiment of the present disclosure, the ratio of the length L to the height H of the body portions 112 may be equal to or higher than 1000.

These values are feasible with the present MEMS technology, as shown, for example, in *Journal of Microelectromechanical System*, Vol. 20, N5, October 2011.

According to an embodiment of the present disclosure, each cantilevered member 110 is provided with two conductive (e.g., metallic) tracks 132, 134 electrically coupled to the piezoelectric material 120 of the corresponding body portion 112 at spaced apart regions of the piezoelectric material spaced apart along the direction Z. According to an embodiment of the present disclosure, each conductive track 132 contacts the collector layer 122 of the corresponding body portion 112, and each conductive track 134 contacts the collector layer 124 of the corresponding body portion 112.

In operation, when the central layer 120 made of a piezoelectric material bends, a corresponding voltage difference develops across the conductive tracks 132, 134 of the cantilevered member 110.

According to an embodiment of the present disclosure, each one of the conductive tracks 132, 134 extends parallel to the direction Y along a top surface (i.e., a surface parallel to directions Y and Z) of a respective collector layer 122, 124 of the cantilevered member 110.

According to an embodiment of the present disclosure, the cantilevered members 110 of the PEH device 100 are electrically connected in parallel to each other, with the conductive tracks 132 of each cantilevered member 110 that are connected to a same first common conductive track 142 and the conductive tracks 134 of each cantilevered member 110 that are connected to a same second common conductive track 144. According to an embodiment of the present disclosure, the first and second common conductive tracks 142, 144 extend along the main surface 106 of the semiconductor substrate 105.

According to an embodiment of the present disclosure, the piezoelectric material forming the central layers 120 of the body portions 112 advantageously has a crystalline orientation aligned along the direction of the body portions 112 in-plane vibration. According to an embodiment of the present disclosure, the crystalline orientation of the piezoelectric material is perpendicular to the two collector layers 122, 124—i.e., when the body portion 112 is not oscillating, parallel to direction Z. In this way, when the body portion 112 vibrates parallel to the main surface 106 of the semiconductor substrate 105, the piezoelectric material forming the central layers 120 bends along its crystalline orientation, thus increasing the conversion efficiency.

Compared to known solutions, in which the piezoelectric material comprised in the body portion of the cantilevered member is in the form of a thin (along direction X) layer parallel to directions Y and Z, and therefore subjected to unwanted upward or downward bending, the cantilevered members 110 according to the embodiments of the present disclosure have body portions 120 in which the piezoelectric material is in the form of a thick (along direction X) layer parallel to directions (X and Y), and therefore is not (or at least is less) subjected to unwanted upward or downward bending. Therefore, compared to the known solution, according to the embodiments of the present disclosure, it is possible to provide longer (along direction Y) body portions 120, reducing thus the resonance frequency of the vibration and consequently increasing the conversion efficiency of the PEH device 100.

According to an embodiment of the present disclosure, each cantilevered member 110 further comprises a seismic mass portion 160 located at a free end of the body portion 112 (i.e., the end thereof opposite to the one connected to the side surface 108 of the semiconductor substrate 105). According to an embodiment of the present disclosure, the seismic mass portion 160 is made of a semiconductor material, such as silicon. According to an embodiment of the present disclosure, the seismic mass portion 160 comprises a first sub-portion 162 connected to an exposed surface (i.e., not contacting the central layer 120) of the collector layer 122 and a second sub-portion 164 connected to an exposed surface (i.e., not contacting the central layer 120) of the collector layer 124.

According to an embodiment of the present disclosure, the first sub-portion 162 extends, along direction X, for the entire thickness of the collector layer 122. According to an embodiment of the present disclosure, the second sub-portion 164 extends, along direction X, for the entire thickness of the collector layer 124.

The resonance frequency of the body portion 112 vibration strongly depends on the mass of the seismic mass portion 160.

Compared to the known solutions, in which the use of a seismic mass force to reduce the aspect ratio (e.g., the length) of the body portions of the cantilevered member to avoid bending on the piezoelectric layer that negatively affect the conversion efficiency, the peculiar structure of the body portion 112 according to the embodiments of the disclosure, with a thick (along direction X) layer of piezoelectric material, is able to support larger seismic mass portion 160 having larger masses, reducing thus the resonance frequency of the vibration—such as bringing it in the ambient vibration frequency range, i.e., lower than 1 KHz—and consequently increasing the conversion efficiency of the PEH device 100.

According to an embodiment of the present disclosure, the semiconductor substrate 105 is movably coupled to a fixed substrate (schematically illustrated in FIG. 1B with reference 170) of the PEH device 100 by means of an elastic support structure 180, such as, for example, a spring member.

In operation, when the PEH device 100 moves or vibrate or is subjected to variable accelerations, the cantilevered members 110, and particularly the body portions 112 thereof, starts to vibrate along a direction perpendicular to the direction X (in-plane vibration).

According to an embodiment of the present disclosure in which the PEH device 100 comprises a plurality of cantilevered members 110, each body portion 112 starts to vibrate at the resonance frequency, generating a corresponding AC signal across the corresponding collector layers 122, 124—and thus across the corresponding conductive tracks 132, 134.

During a starting transition period, each cantilevered member 110 generally vibrate independently from the other cantilevered members 110. Therefore, the various AC signals generated by the various cantilevered members 110 will oscillate out of phase to each other, and no useful signal across the common conductive tracks 142, 144 can be collected because of destructive interference.

Since all the cantilevered members 110 are connected to a same semiconductor substrate 105 that is in turn movably coupled to the fixed substrate 170 by means of an elastic support structure 180, the semiconductor substrate 105 oscillates as well, synchronizing in turn the vibration of all the cantilevered members 110 according to the known "chaotic synchronization principle" (see, for example, "*Synchronization of coupled mechanical oscillators in the presence of noise and parameter mismatch*" by Anna Karmazyn, Lodz University of Technology, Faculty of Mechanical Engineering, Division of Dynamics, 2014).

In this way, after the starting transition period is expired, an AC signal is collected across the common conductive tracks 142, 144 which is proportional to the number of cantilevered members 100 included in the PEH device 100. Moreover, since the cantilevered members 110 vibrates in a synchronous way, there is no need of a rectifier circuit for each cantilevered member 110 (for rectifying the signal generated by the single cantilevered member 110 across its corresponding conductive tracks 132, 134), but rather it is sufficient to provide a single rectifier circuit for rectifying the signal across the common conductive tracks 142, 144.

According to an embodiment of the present disclosure, the common conductive tracks 142, 144 cross the elastic support structure 180 for reaching the fixed substrate 170.

According to an alternative embodiment of the present disclosure (not illustrated), a multi-frequency PEH device 100 can be provided, in which some or each of the cantilevered members 110 are configured to generate AC signals oscillating at different frequencies by properly setting the ratio among the length L, width W, and height H of the body portion 112 and/or the mass of the seismic mass portion 160 of each cantilevered member 110 in an individual way.

According to an alternative embodiment of the disclosure, the collector layers 122, 124 may comprise a different conductor material, such as a metallic material in form of layers contacting the central layer 120 made of piezoelectric material.

According to other embodiments of the present disclosure, the central layer 120 may comprise piezoelectric materials different from AN, such as scandium-enriched aluminum nitride (Sc—AlN) or lead zyrconate titanate (PZT).

Figure 2A:
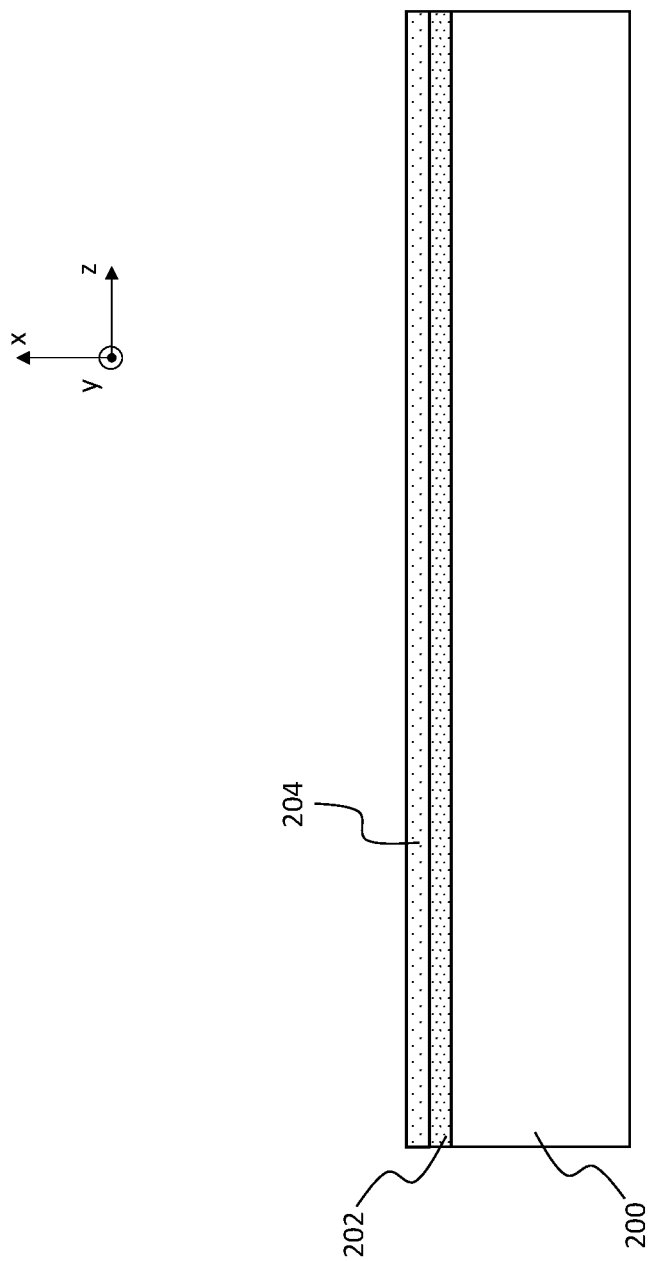
FIGS. 2A-2N illustrate main steps of a method for manufacturing the PEH device of FIGS. 1A and 1B according to embodiments of the present disclosure.
Figure 2B:
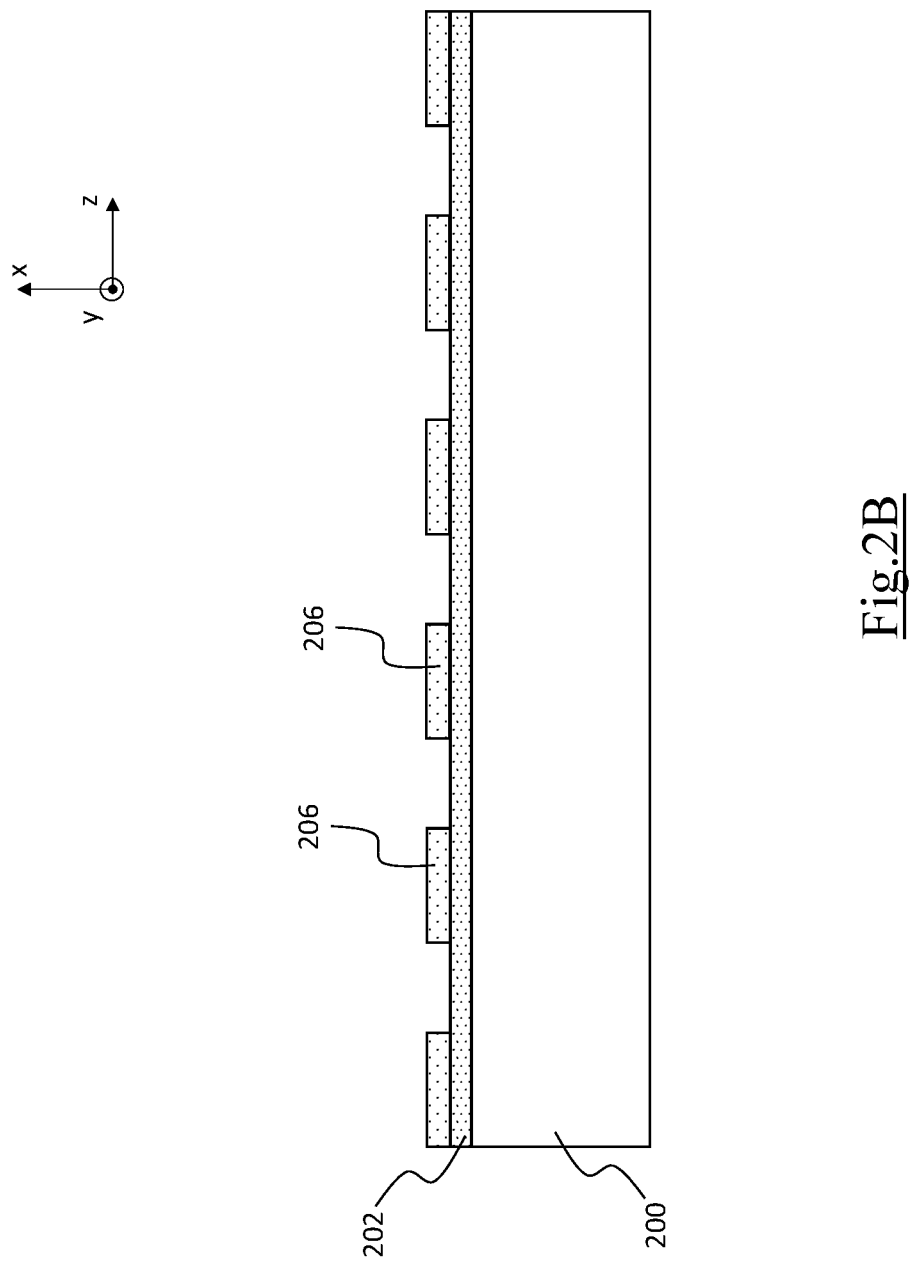
Figure 2C:
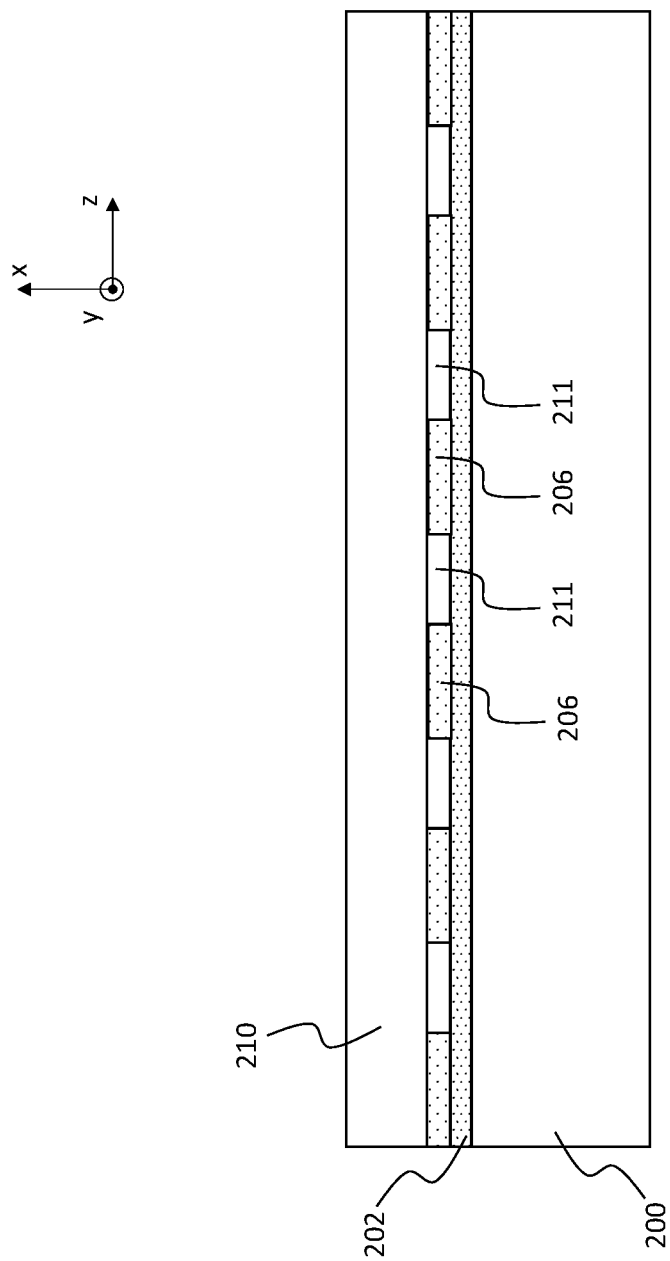
Figure 2D:
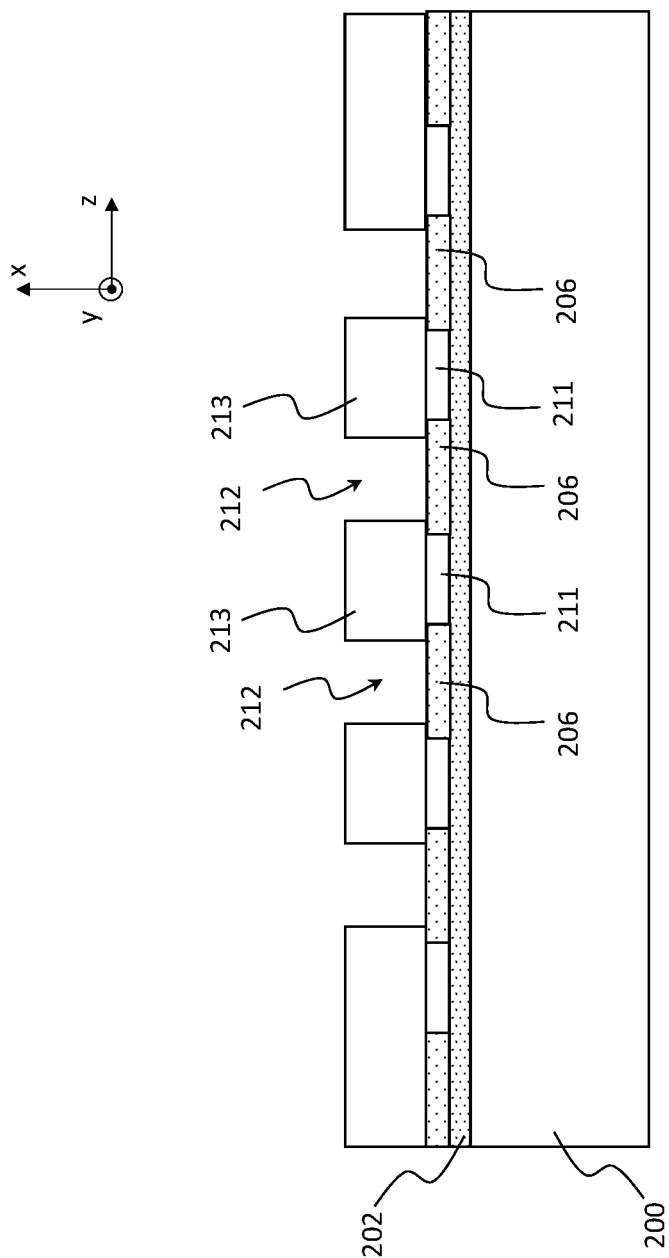
Figure 2E:
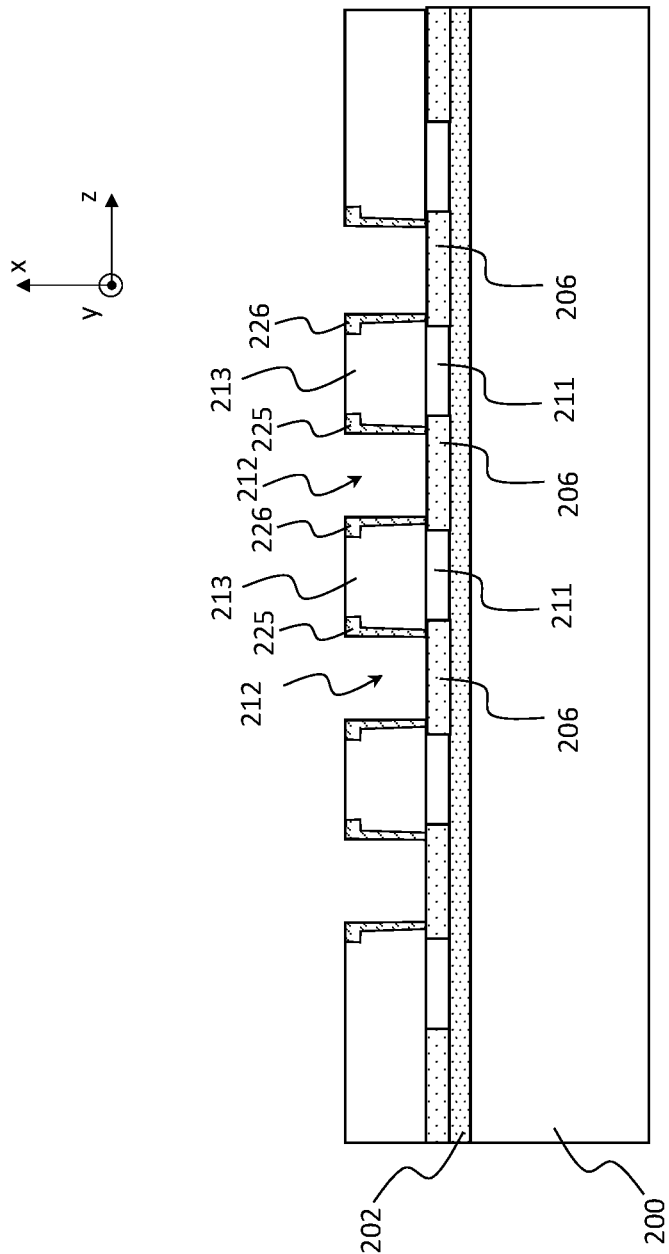
Figure 2F:
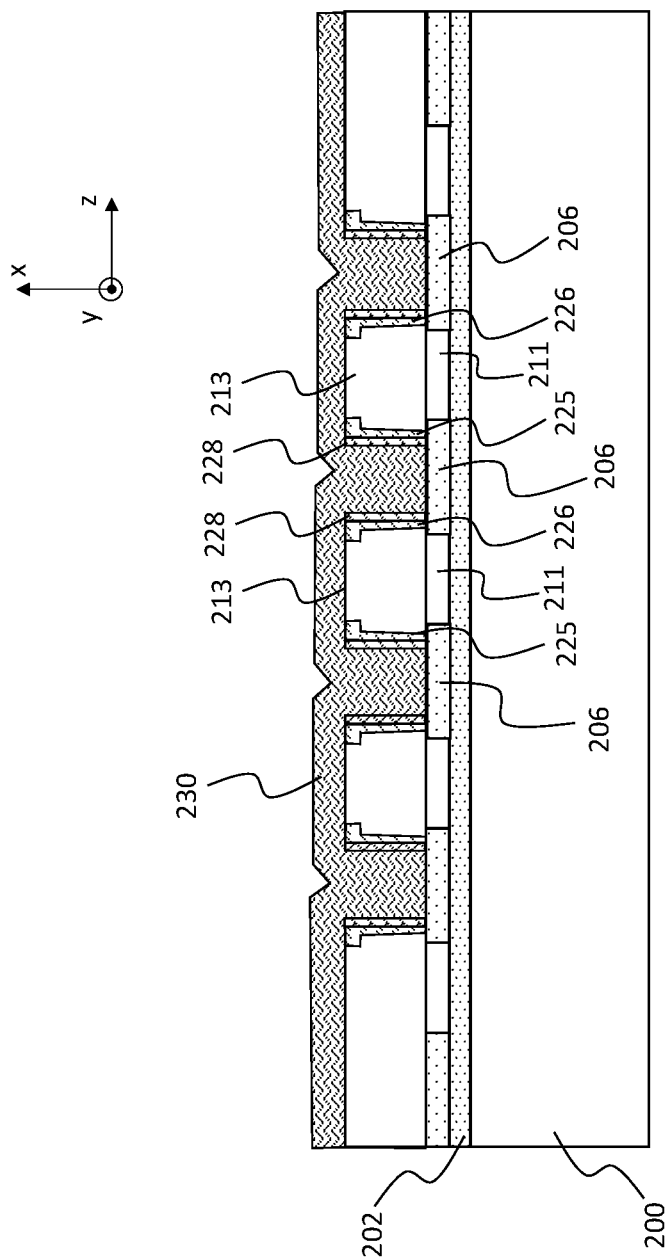
Figure 2G:
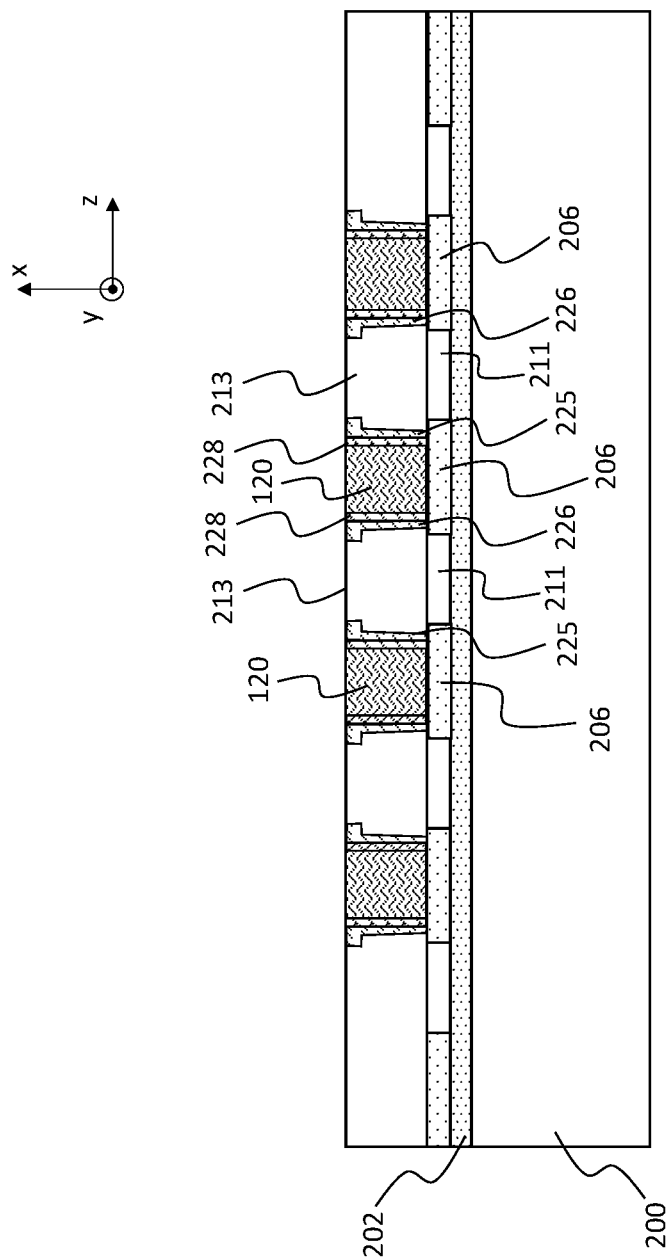
Figure 2H:
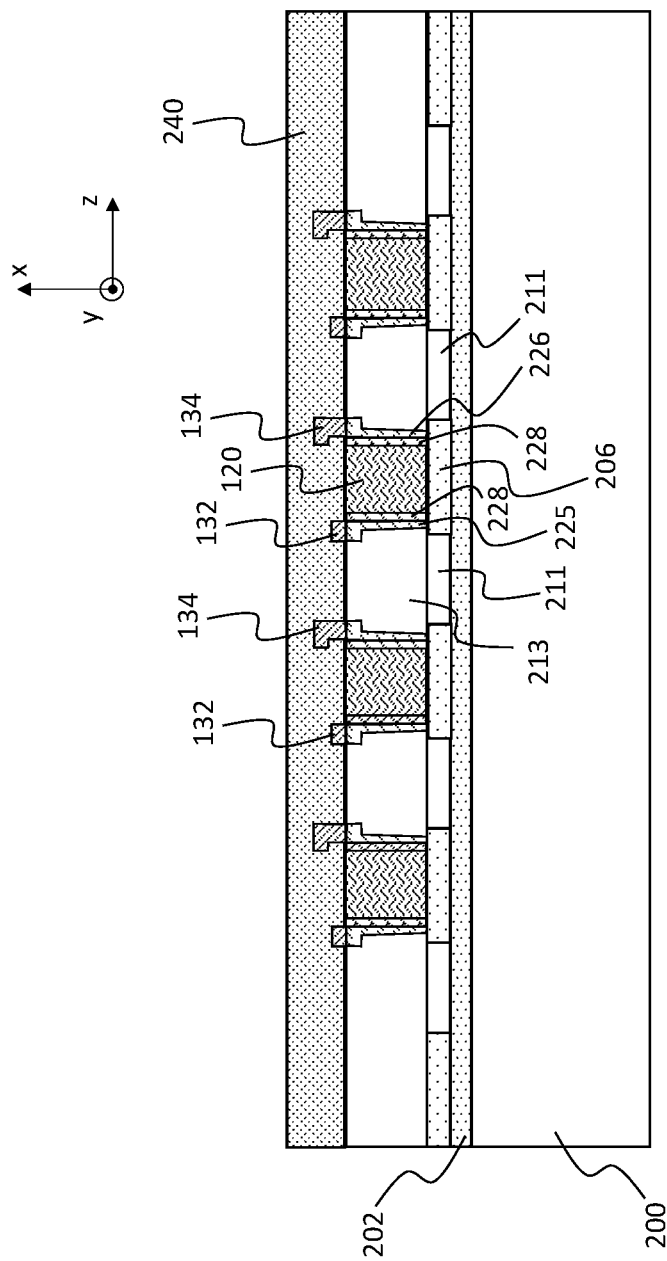
Figure 2I:
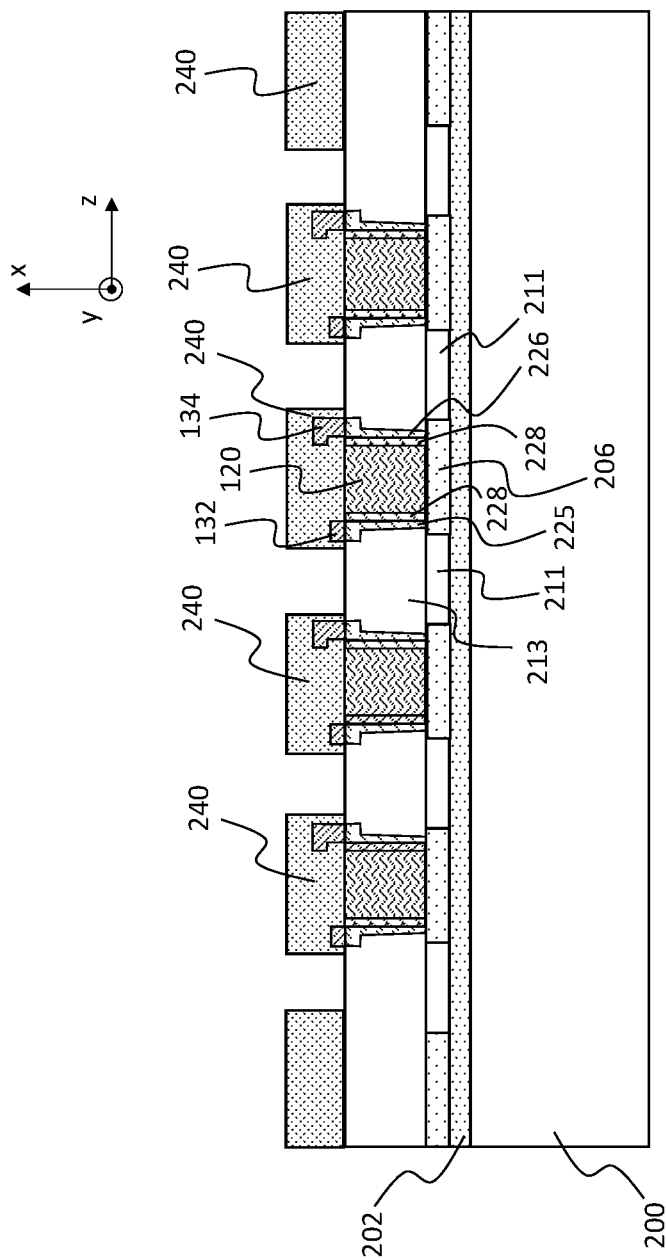
Figure 2J:
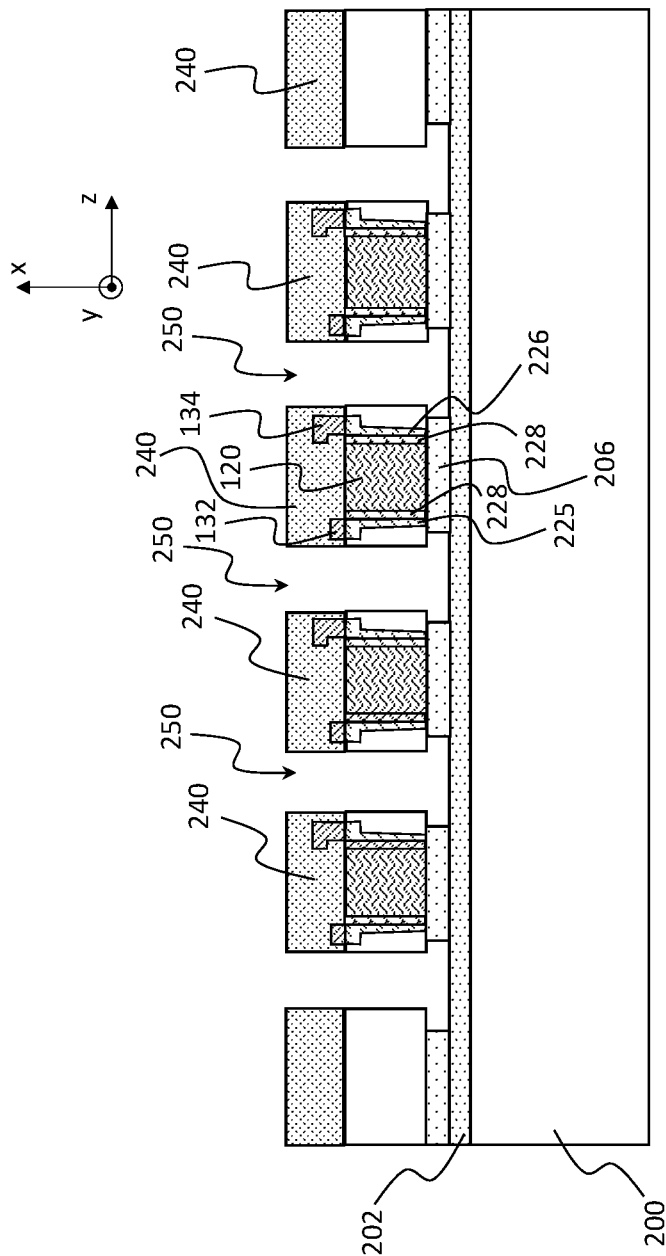
Figure 2K:
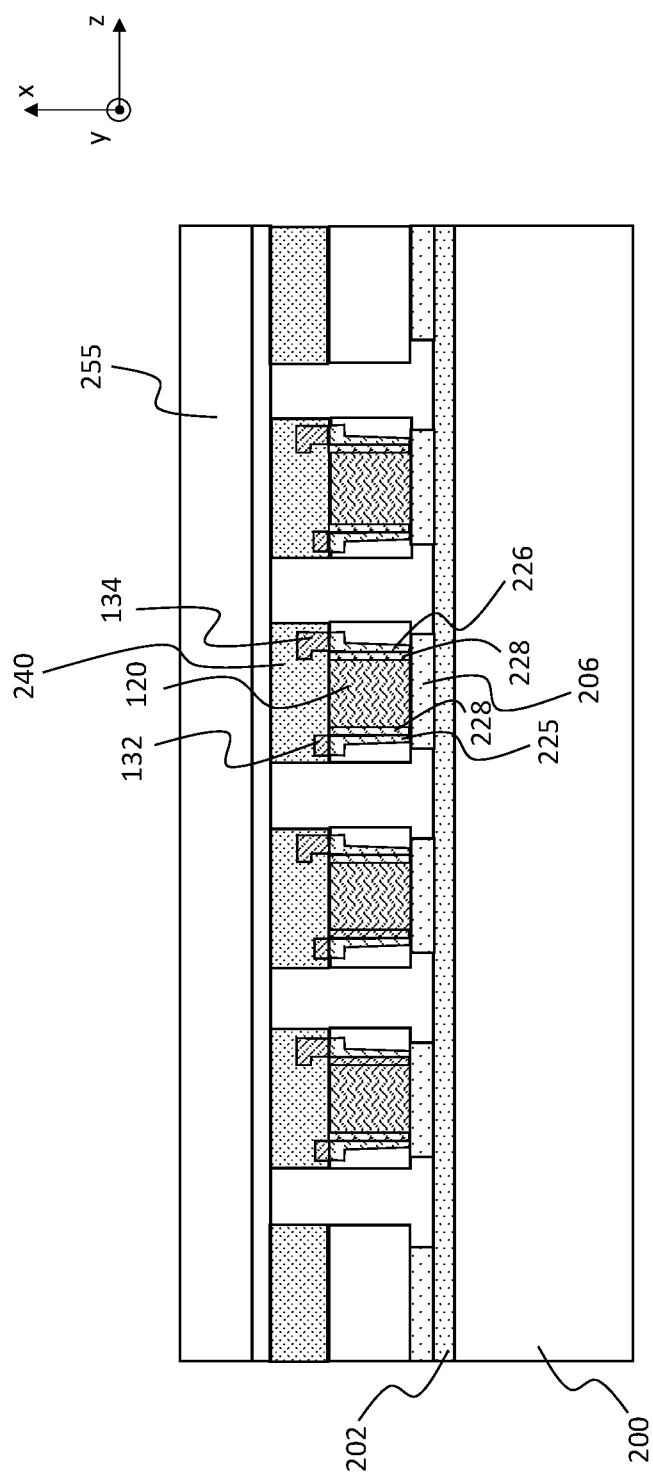
Figure 2L:
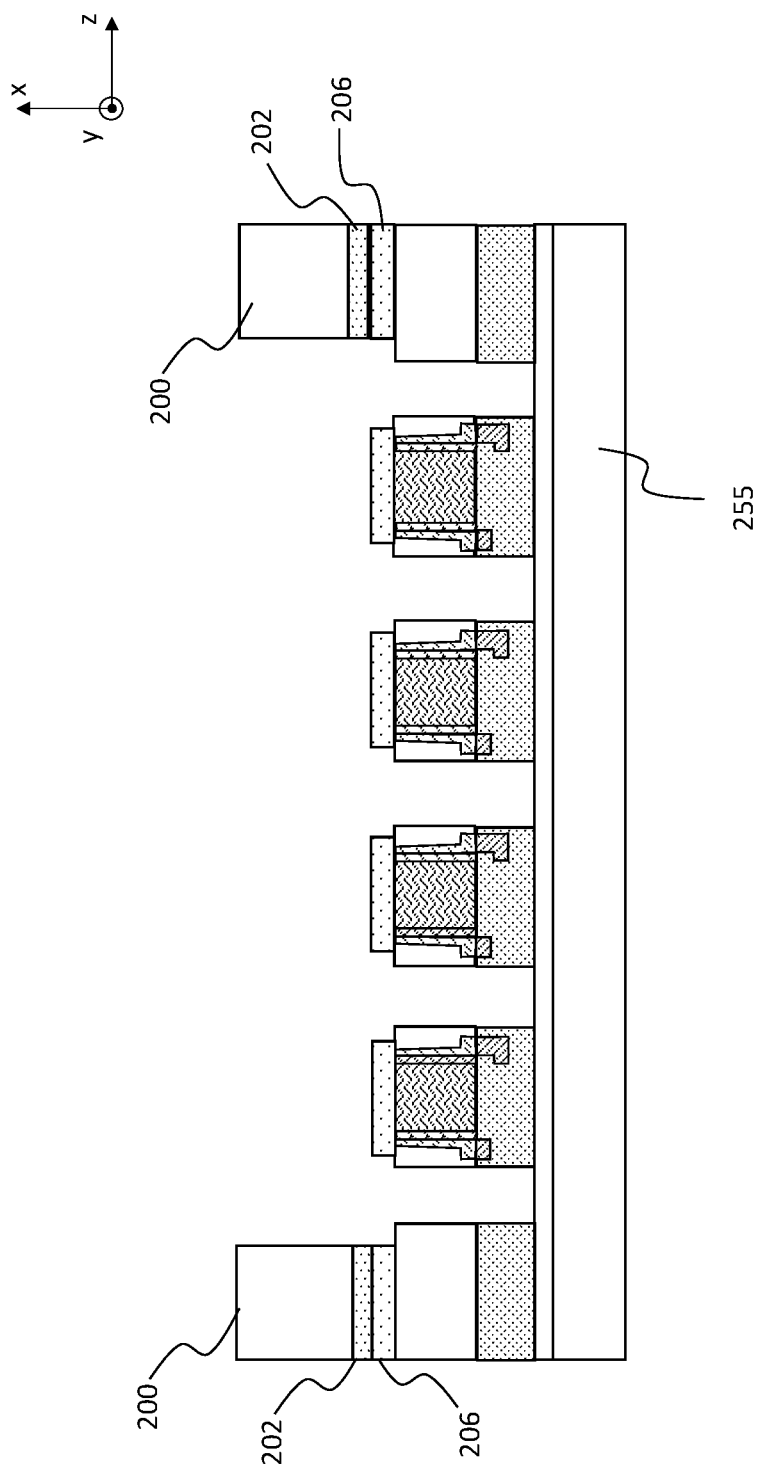
Figure 2M:
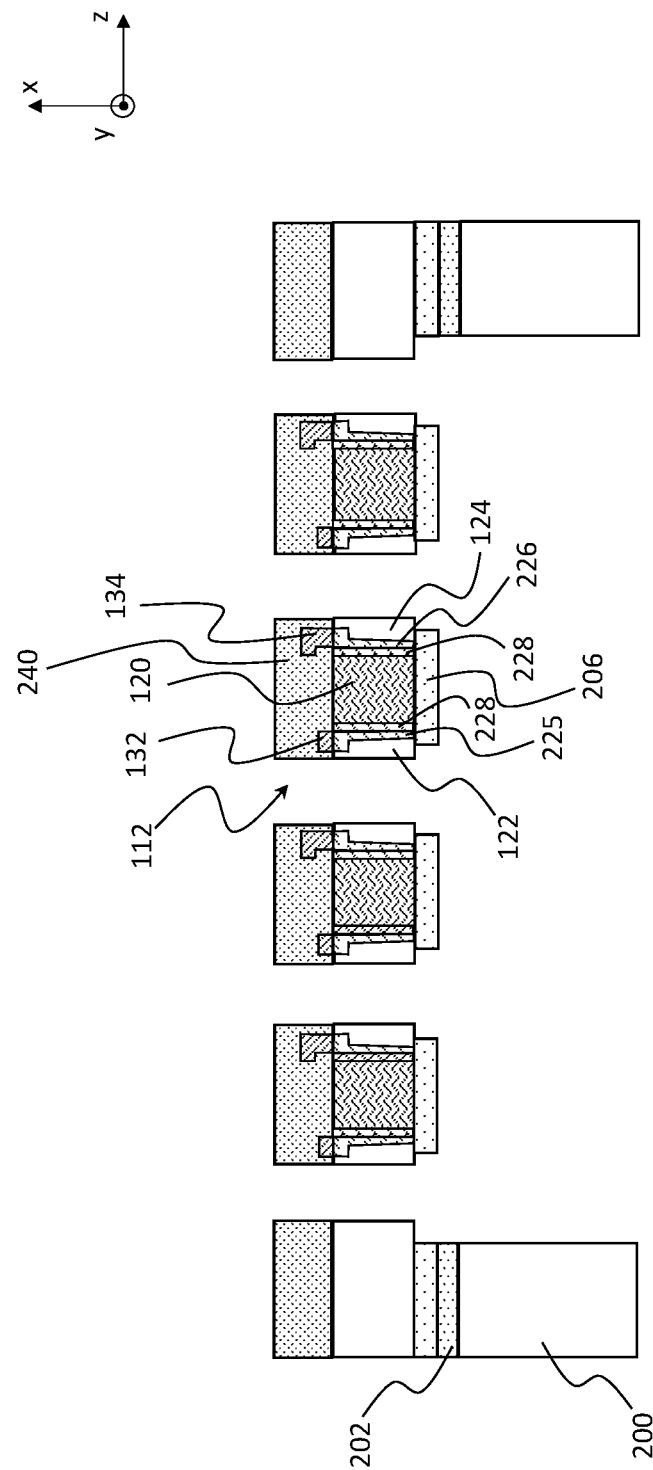
Figure 2N:
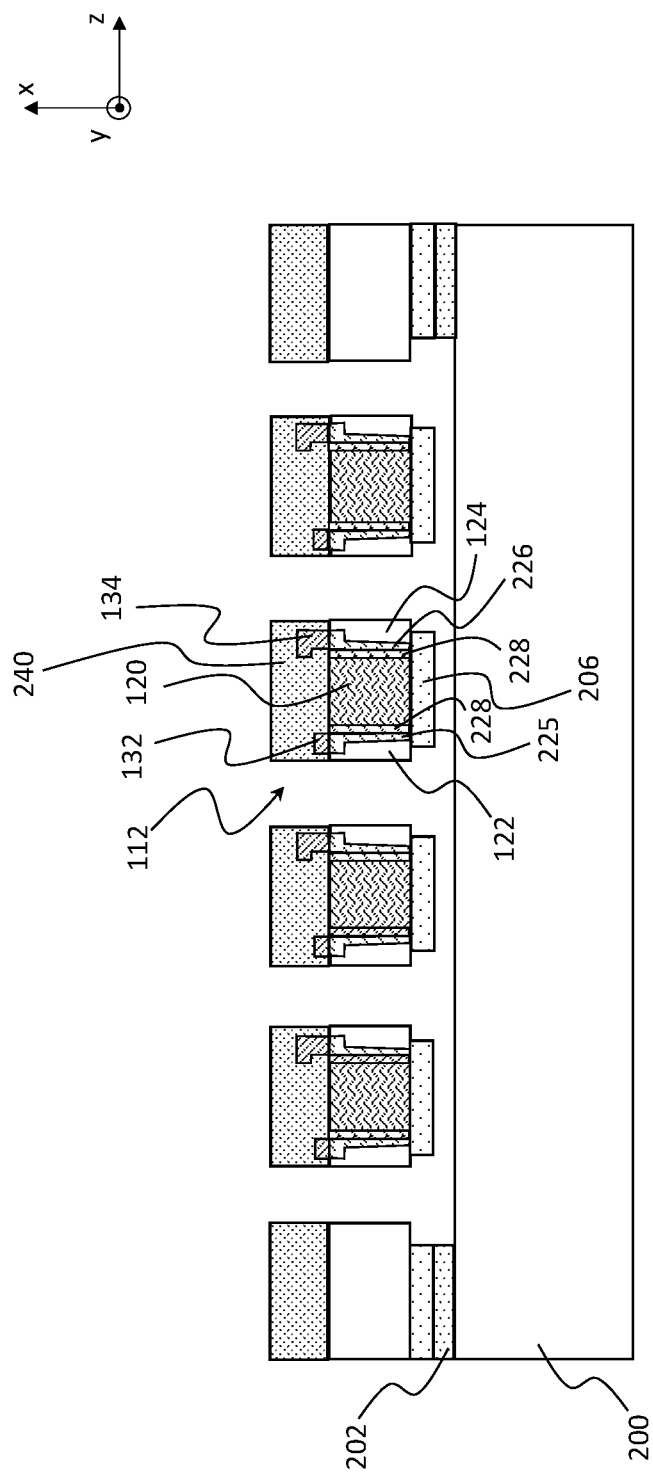

FIGS. 2A-2N illustrate main steps of a method for manufacturing the PEH device 100 of FIGS. 1A and 1B according to embodiments of the present disclosure.

Particularly, FIGS. 2A-2N are cross sectional views of the PEH device 100 during the main steps of the manufacturing method taken along a section plane A-A parallel to the directions X and Z and crossing the body portions 112 of the cantilevered members 110 (see FIG. 1B).

Making reference to FIG. 2A, the manufacturing process according to an embodiment of the present disclosure starts by providing a semiconductor (e.g., silicon) substrate 200, forming an oxide layer 202, such as silicon dioxide ($SiO_2$) over a top surface of the semiconductor substrate 200, and then deposing an aluminum oxide ($Al_2O_3$) layer 204 on the oxide layer 202. For example, the oxide layer 202 may be formed by thermally oxidizing the surfaces of the semiconductor substrate 200 and then selectively removing the growth oxide from the side and bottom surfaces of the semiconductor substrate 200.

According to an embodiment of the present disclosure illustrated in FIG. 2B, the next phase of the manufacturing process according to an embodiment of the present disclosure provides for selectively removing sections of the aluminum oxide layer 204 until exposing the underlying oxide layer 202 in order to define a plurality of separated aluminum oxide portions 206 spaced apart to each other along the direction Z.

Making reference to FIG. 2C, the following phase of the manufacturing process according to an embodiment of the present disclosure provides for attaching a silicon wafer 210 on the exposed surfaces of the aluminum oxide portions 206, so as to form cavities 211 between adjacent aluminum oxide portions 206. According to an embodiment of the present disclosure, this phase is carried out by means of a silicon wafer fusion bonding procedure, such as the one disclosed in "*Direct Bonding of Oxidized Cavity Wafers*" by M. Palokangas, J. Dekker, K. Henttinen and J. Mäkinen, ECS Transactions, 16 (8) 457-463 (2008), or in "*Silicon-on-Insulator Wafers with Buried Cavities*" by T. Suni, K. Henttinen, J. Dekker, H. Luoto, M. Kulawski, J. Mäkinen and R. Mutikainen, Journal of the Electrochemical Society, 153 (4) G299-G303 (2006).

According to an embodiment of the present disclosure illustrated in FIG. 2D, the next phase of the manufacturing process according to an embodiment of the present disclosure provides for selectively removing sections of the attached silicon wafer 210 at selected aluminum oxide portions 206 until exposing portions of surfaces of said aluminum oxide portions 206. In this way, an alternating sequence of recesses 212 and silicon portions 213 (each one astride two respective oxide portions 260) is formed along direction Z, with each recess 212 having a bottom surface corresponding to an exposed surface portion of a corresponding aluminum oxide portion 206 and side surfaces corresponding to side surfaces of two silicon portions 213.

For example, this phase may comprise carrying out dry etching followed by silicon vertical wall planarization (for example, through a scallop erase technique or using tetramethylammonium hydroxide (TMAH)). As it will be described in the following, the recesses 212 will be used to define the piezoelectric material central layers 120 of the body portions 112 of the cantilevered members 100, while parts of the silicon portions 213 will form the collector layers 122, 124.

Making reference to FIG. 2E, the following phase of the manufacturing process according to an embodiment of the present disclosure provides for implanting doping impurities (e.g., of the p type) into side surfaces of the silicon portions 213 surrounding each recess 212 for modifying their conductivity. In this way, for each recess 212 a corresponding first implanted region 225 and a second implanted region 226 are formed in the two silicon portions 213 surrounding said recess 212. According to another embodiment of the present disclosure, instead of forming the first implanted region 225 and a second implanted region 226, a metal layer is deposed so as to cover the side surfaces of the silicon portions 213 surrounding each recess 212.

As it is illustrated in FIG. 2F, according to an embodiment of the present disclosure, after a thin film 228 of piezoelectric material, e.g., AlN, is grown on the doped side surfaces of the silicon portions 213, the next phase provides for deposing a layer 230 of piezoelectric material, e.g., AlN, to fill the recesses 212. Other usable piezoelectric materials may comprise Sc—AlN and PZT.

According to an embodiment of the present disclosure, the layer 230 is deposed using a reactive sputtering deposition procedure using the thin films 228 as seeds. For example, the layer 230 can be deposed according to the deposition technique described in "*From the Bottom-Up: toward Area-Selective atomic Layer Deposition with High Selectivity*" by Adriaan J. M. MAckus, Marc J. M. Merkx, and Wilhelmus M. M. Kessels, Chemistry of Materials 2019 31 (1), 2-12.

Alternative methods for deposing the layer 230 may comprise Physical Vapor Deposition (PVD) or Chemical Solution Deposition (CSD).

Since the piezoelectric material of the layer 230 filling the recesses 212 will form the central layers 120 of the body portions 112 configured to oscillate by an in-plane vibration, according to an embodiment of the present disclosure the layer 230 is deposed in such a way to have a crystalline orientation aligned along direction Z (i.e., aligned with the in-plane vibration). Moreover, the crystalline orientation aligned along direction Z allows to increase the mechanical rigidity of the body portions 112, and therefore of the cantilevered elements 110, which are less prone to unwanted bending along direction X.

According to an embodiment of the present disclosure, the layer 230 is deposed with a conformal coverage of the recesses avoiding the formation of voids.

Making reference to FIG. 2G, the next phase of the manufacturing process according to an embodiment of the present disclosure provides for removing (e.g., through dry etching) portions of the deposed layer 230 of piezoelectric material, until exposing top surfaces of the silicon portions 213, so as to define the central layers 120 of the body portions 112 (see FIGS. 1A and 1B). Each central layer 120 is surrounded by a first implanted region 225 of a silicon portion 213 and by a second implanted region 226 of another silicon portion 213.

Without providing details not relevant for the understanding of the present disclosure, and well known to those skilled in the art, according to an embodiment of the present disclosure, the following phase illustrated in FIG. 2H provides for forming the conductive tracks 132, 134 for contacting the collector layers 122, 124 (see FIGS. 1A and 1B). According to an embodiment of the present disclosure, the conductive tracks 132, 134 are formed by metal depositions on dielectric—e.g., silicon nitride (SiN)—layers 240, with said dielectric layers 240 that are properly patterned in such a way that the first implanted regions 225 are electrically connected to the conductive track 132, and the second implanted regions 226 are electrically connected to the conductive track 134. It has to be appreciated that since in the final PEH device 100 the various cantilevered members 110 will be electrically connected in parallel to each other, with the conductive tracks 132 of each cantilevered member 110 that are connected to a same first common conductive track 142 and the conductive tracks 134 of each cantilevered member 110 that are connected to a same second common conductive track 144 (see FIGS. 1A and 1B), the conductive tracks 132 and the conductive tracks 134 are advantageously formed at two different heights along the direction X. In the illustrated example, the conductive tracks 132 are formed at a lower height compared to the conductive tracks 134, however similar considerations apply in case conductive tracks 132 are formed at a higher height compared to the conductive tracks 134.

Then, according to an embodiment of the present disclosure illustrated in FIG. 2I, portions of the dielectric layer 240 over (along direction X) the cavities 211 are removed until exposing part of the top surface of each underlying silicon portion 213. According to an embodiment of the present disclosure, this phase is carried out by means of a dry etching procedure.

According to an embodiment of the present disclosure illustrated in FIG. 2J, vias 250 are opened in the silicon portions 213 through dry etching using the patterned dielectric layer 240 as a mask until reaching the underlying cavities 211. The remaining parts of the silicon portions 213 surrounding each central layer 120 (and comprising the first and second implanted regions 225, 226) form the collector layers 122, 124 of the body portion 112 including said central layer 120.

According to an embodiment of the present disclosure, in order to form the body portions 112 of the cantilevered members 110 and obtain the final PEH device 100, the following final phases are carried out after the phase illustrated in FIG. 2J:
- a further silicon wafer 255 is temporary bonded to the (remaining portions of the) patterned dielectric layer 240 (see FIG. 2K);
- the structure so far obtained is turned upside-down in such a way that a bottom surface of the semiconductor substrate 200 is facing upward;
- a dry etching operation is carried out for removing a portion of the semiconductor substrate 200 from the now exposed surface and a corresponding portion of the oxide layer 202 until reaching the cavities 211 and exposing the aluminum oxide portions 206 (see FIG. 2L);
- the structure so far obtained is turned upside-down again, the further silicon wafer 255 is de-bonded and removed, so as to form the body portions 112 of the cantilevered members 110 and obtain the final PEH device 100 (see FIG. 2M).

According to an alternative embodiment of the present disclosure illustrated in FIG. 2N, the body portions 112 of the cantilevered members 110 are formed without requiring a temporary bonding of an additional silicon wafer and without requiring upside-down turn operations, but rather by removing a portion of the oxide layer 202 under the aluminum oxide portions 206 and under the aluminum oxide portions 206 through vapor or liquid hydrofluoric acid (HF).

Figure 3:
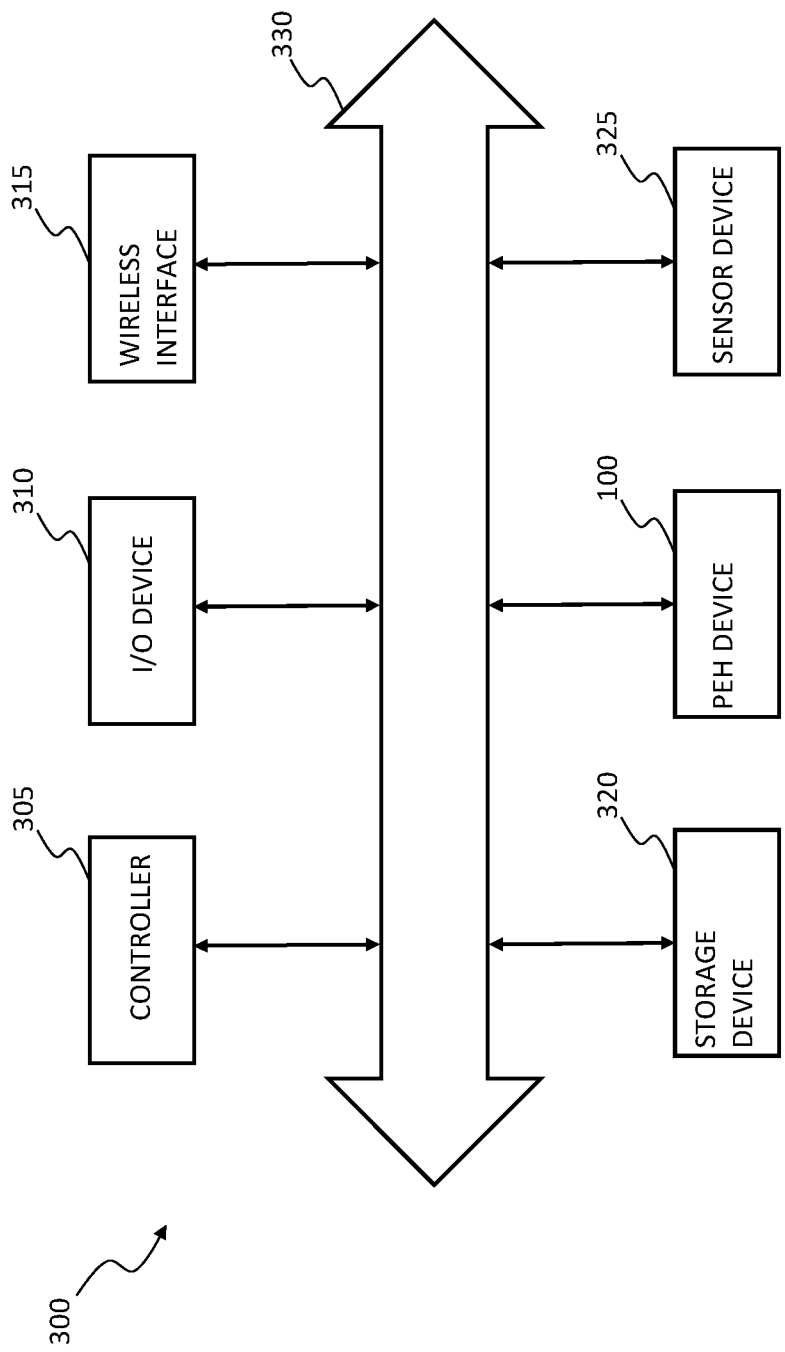
FIG. 3 illustrates in terms of simplified blocks an electronic system comprising at least one PEH device of FIGS. 1A and 1B according to embodiments of the disclosure.

FIG. 3 illustrates in terms of simplified blocks an electronic system 300 (or a portion thereof) comprising at least one PEH device 100 according to the embodiments of the disclosure described above.

According to an embodiment of the present disclosure, the electronic system 300 is an electronic device for low power applications, such as, for example, an IoT sensing node adapted to be powered by the PEH device 100.

According to an embodiment of the present disclosure, the electronic system 300 may comprise, in addition to the PEH device 100, a controller 305, such as, for example, one or more microprocessors and/or one or more microcontrollers.

According to an embodiment of the present disclosure, the electronic system 300 may comprise, in addition to the PEH device 100, an input/output device 310 (such as, for example, a keyboard, and/or a touch screen and/or a visual display) for generating/receiving messages/commands/data, and/or for receiving/sending digital and/or analogic signals.

According to an embodiment of the present disclosure, the electronic system 300 may comprise, in addition to the PEH device 100, a wireless interface 315 for exchanging messages with a wireless communication network (not shown), for example, through radiofrequency signals. Examples of wireless interface 315 may comprise antennas and wireless transceivers.

According to an embodiment of the present disclosure, the electronic system 300 may comprise, in addition to the PEH device 100, a storage device 320, such as, for example, a volatile and/or a non-volatile memory device.

According to an embodiment of the present disclosure, the electronic system 300 may comprise, in addition to the PEH device 100, a sensor device 325, for example, an accelerometer sensor, a temperature sensor, a pressure sensor, or an acoustic sensor.

According to an embodiment of the present disclosure, the electronic system 300 may comprise one or more communication channels (buses) for allowing data exchange between the PEH device 100 and the controller 305, and/or the input/output device 310, and/or the wireless interface 315, and/or the storage device 320, and/or the sensor device 325, when they are present.

Naturally, in order to satisfy local and specific requirements, a person skilled in the art may apply to the solution described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments of the disclosure may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the disclosure may be incorporated in other embodiments.

For example, although in the present description reference has been mainly made to a PEH device and a manufacturing method thereof, the concepts of the present disclosure can be applied to other kind of MEMS devices comprising cantilevered members comprising piezoelectric material.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a MEMS device, comprising:
forming at least one cantilevered member protruding from a side surface of a semiconductor substrate, the semiconductor substrate including a main surface extending perpendicular to a first direction and a side surface extending on a plane parallel to the first direction and to a second direction, the second direction being perpendicular to the first direction, the at least one cantilevered member protruding from the side surface along a third direction perpendicular to the first and second directions, forming the at least one cantilevered member comprises:
forming oxide portions on a starting semiconductor substrate having a first surface, the oxide portions being raised with respect to the first surface along the first direction, and being spaced apart to each other along the second direction;
forming semiconductor portions on portions of exposed surfaces of the oxide portions to define an alternating sequence of recesses and semiconductor portions, each semiconductor portion being astride two oxide portions and defining a corresponding cavity with the two oxide portions, each recess having a bottom surface corresponding to an exposed surface portion of an oxide portion and side surfaces corresponding to side surfaces of two semiconductor portions;
filling the recesses with a piezoelectric material, the filling the recesses with the piezoelectric material includes filling the recesses with the piezoelectric material having a crystalline orientation perpendicular to the first direction; and
forming the at least one cantilevered member by opening vias in the semiconductor portions along the first direction until reaching the cavities;
wherein the at least one cantilevered member comprises a body portion including a piezoelectric material, the body portion having a length along the third direction, a height along the first direction and a width along the second direction, the height being greater than the width, the at least one cantilevered member being configured to vibrate by lateral bending along a direction perpendicular to the first direction.

2. The method of claim 1, wherein the forming semiconductor portions on portions of exposed surfaces of the oxide portions comprises:
attaching a semiconductor wafer to the portions of exposed surfaces of the oxide portions through wafer fusion bonding; and
selectively removing sections of the attached semiconductor wafer.

3. The method of claim 1, wherein the filling the recesses with the piezoelectric material comprises:
growing piezoelectric material films on the side surfaces of the semiconductor portions; and
depositing a layer of piezoelectric material to fill the recesses through reactive sputtering deposition using the piezoelectric material film as seeds.

4. A method, comprising:
forming a first oxide layer at a surface of a first substrate;
forming a second oxide layer on the first oxide layer;
forming a plurality of first openings in the second oxide layer exposing a plurality of exposed regions of the first oxide layer and forming a plurality of portions of the second oxide layer;
attaching a second substrate to the second oxide layer;
forming a plurality of second openings extending through the second substrate, each respective second opening of the plurality of second openings extending to a corresponding portion of the plurality of portions of the second oxide layer, forming the plurality of second openings forms separated portions made from the second substrate that are separated from each other;
forming a plurality of implanted regions along sidewalls of the separated portions;
forming thin films of a first piezoelectric material on the plurality of implanted regions;
forming a plurality of portions made of a second piezoelectric material by forming the second piezoelectric material in the plurality of second openings;
forming a plurality of conductive tracks coupled to the plurality of implanted regions; and
forming a plurality of third openings extending through the second substrate and spaced apart from the plurality of portions made of the second piezoelectric material, forming the plurality of third openings forms a plurality of seismic mass portions made of the second substrate on the plurality of implanted regions.

5. The method of claim 4, further comprising:
forming a dielectric layer on the plurality of conductive tracks, on the plurality of portions of the second piezoelectric material, and on the second substrate; and
before forming the third openings, forming a plurality of fourth openings through the dielectric layer exposing regions of the second substrate, and
wherein forming the plurality of third openings to be aligned with the plurality of fourth openings at the regions of the second substrate exposed by forming the plurality of fourth openings.

6. The method of claim 5, wherein forming the plurality of third openings extending through the second substrate further includes each respective third opening of the plurality of third openings extending to a corresponding first opening of the plurality of first openings.

7. The method of claim 6, further comprising:
coupling a third substrate to the dielectric layer; and
removing a portion of the first substrate.

8. The method of claim 7, further comprising:
after removing the portion of the first substrate, removing the third substrate from the dielectric layer.

9. The method of claim 7, wherein removing the portion of the first substrate exposes the plurality of portions of the second oxide layer.

10. The method of claim 7, wherein, after coupling the third substrate to the dielectric layer and before removing the portion of the first substrate, flipping the third substrate to which the dielectric is coupled.

11. The method of claim 4, further comprising forming the plurality of implanted regions on the plurality of portions of the second oxide layer.

12. The method of claim 4, wherein the plurality of seismic masses are formed on the plurality of portions of the second oxide layer.

13. A method, comprising:
forming a second oxide layer on a first oxide layer extending along a surface of a first substrate;
forming a plurality of separated portions of the second oxide layer by forming a plurality of first openings through the second oxide layer to the first oxide layer;
coupling a second substrate to the plurality of separated portions of the second oxide layer;
forming a plurality of separated portions of the second substrate by forming a plurality of second openings extending through the second substrate, each respective second opening of the plurality of second openings extending to a corresponding separated portion of the plurality of separated portions of the second oxide layer;
forming a plurality of implanted regions along sidewalls of the plurality of separated portions of the second substrate;
forming a first piezoelectric material filling the plurality second openings, being on plurality of separated portions of the second oxide layer, and being on the plurality of separated portions of the second substrate;
removing a portion of the first piezoelectric material forming a plurality of separated portions of the first piezoelectric material within the plurality of second openings;
forming a plurality of conductive tracks coupled to the plurality of implanted regions; and
forming a plurality of third openings extending through the second substrate and spaced apart from the plurality of separated portions made of the first piezoelectric material, forming the plurality of third openings forms a plurality of seismic mass portions made of the second substrate on the plurality of implanted regions.

14. The method of claim 13, further comprising:
forming a dielectric layer on the plurality of conductive tracks, on the plurality of separated portions of the first piezoelectric material, and on the second substrate; and
before forming the third openings, forming a plurality of fourth openings through the dielectric layer exposing regions of the second substrate, and
wherein forming the plurality of third openings to be aligned with the plurality of fourth openings at the regions of the second substrate exposed by forming the plurality of fourth openings.

15. The method of claim 14, wherein forming the plurality of third openings extending through the second substrate further includes each respective third opening of the plurality of third openings extending to a corresponding first opening of the plurality of first openings.

16. The method of claim 15, further comprising:
coupling a third substrate to the dielectric layer; and
removing a portion of the first substrate.

17. The method of claim 16, wherein, after coupling the third substrate to the dielectric layer and before removing the portion of the first substrate, flipping the third substrate to which the dielectric is coupled.

18. The method of claim 13, further comprising forming the plurality of implanted regions on the plurality of separated portions of the second oxide layer.

19. The method of claim 13, wherein the plurality of seismic masses are formed on the plurality of separated portions of the second oxide layer.

* * * * *

UNITED STATES PATENT AND TRADEMARK OFFICE
CERTIFICATE OF CORRECTION

| | | |
|---|---|---|
| PATENT NO. | : 12,336,432 B2 | |
| APPLICATION NO. | : 18/535923 | |
| DATED | : June 17, 2025 | |
| INVENTOR(S) | : Gianluca Longoni et al. | |

It is certified that error appears in the above-identified patent and that said Letters Patent is hereby corrected as shown below:

In the Claims

<u>Column 15, Claim 13, Lines 32-33:</u>
"the plurality second openings" should read: --the plurality of second openings,--.

Signed and Sealed this
Twenty-third Day of September, 2025

John A. Squires
*Director of the United States Patent and Trademark Office*